(12) United States Patent
Cheng

(10) Patent No.: US 7,375,034 B2
(45) Date of Patent: May 20, 2008

(54) RECESSING TRENCH TO TARGET DEPTH USING FEED FORWARD DATA

(75) Inventor: Kangguo Cheng, Beacon, NY (US)

(73) Assignee: International Business Machines Corporation, Armonk, NY (US)

( * ) Notice: Subject to any disclaimer, the term of this patent is extended or adjusted under 35 U.S.C. 154(b) by 56 days.

(21) Appl. No.: 11/308,394

(22) Filed: Mar. 21, 2006

(65) Prior Publication Data

US 2007/0221619 A1 Sep. 27, 2007

(51) Int. Cl.
*H01L 21/302* (2006.01)
(52) U.S. Cl. .............. 438/700; 438/243; 438/249; 438/714
(58) Field of Classification Search ........ 438/700, 438/706, 710, 714, 720, 243, 249
See application file for complete search history.

(56) References Cited

U.S. PATENT DOCUMENTS

| | | | |
|---|---|---|---|
| 5,578,161 A * | 11/1996 | Auda | 438/9 |
| 6,107,135 A * | 8/2000 | Kleinhenz et al. | 438/249 |
| 6,916,703 B2 * | 7/2005 | Chen et al. | 438/243 |
| 2005/0070112 A1 * | 3/2005 | Pita et al. | 438/700 |

* cited by examiner

*Primary Examiner*—Lan Vinh
(74) *Attorney, Agent, or Firm*—Steven Capella; Hoffman, Warnick & D'Alessancro LLC

(57) ABSTRACT

Recessing a trench using feed forward data is disclosed. In one embodiment, a method includes providing a region on a wafer including a trench area that includes a trench and a field area that is free of any trench, and a material applied over the region so as to fill the trench in the trench area and form a step between the trench area and the field area; etching to partially etch the trench; determining a target etch duration ($t_D$) for etching to the target depth ($D_T$); and etching the trench to the target depth ($D_T$) for a period approximately equal to the target etch duration ($t_D$). The target etch duration $t_D$ may be fed forward for recessing another trench to the target depth $D_T$. The method does not require a send ahead wafer, is fully compatible with conventional automated processes and provides in-situ etch time correction to each wafer.

8 Claims, 4 Drawing Sheets

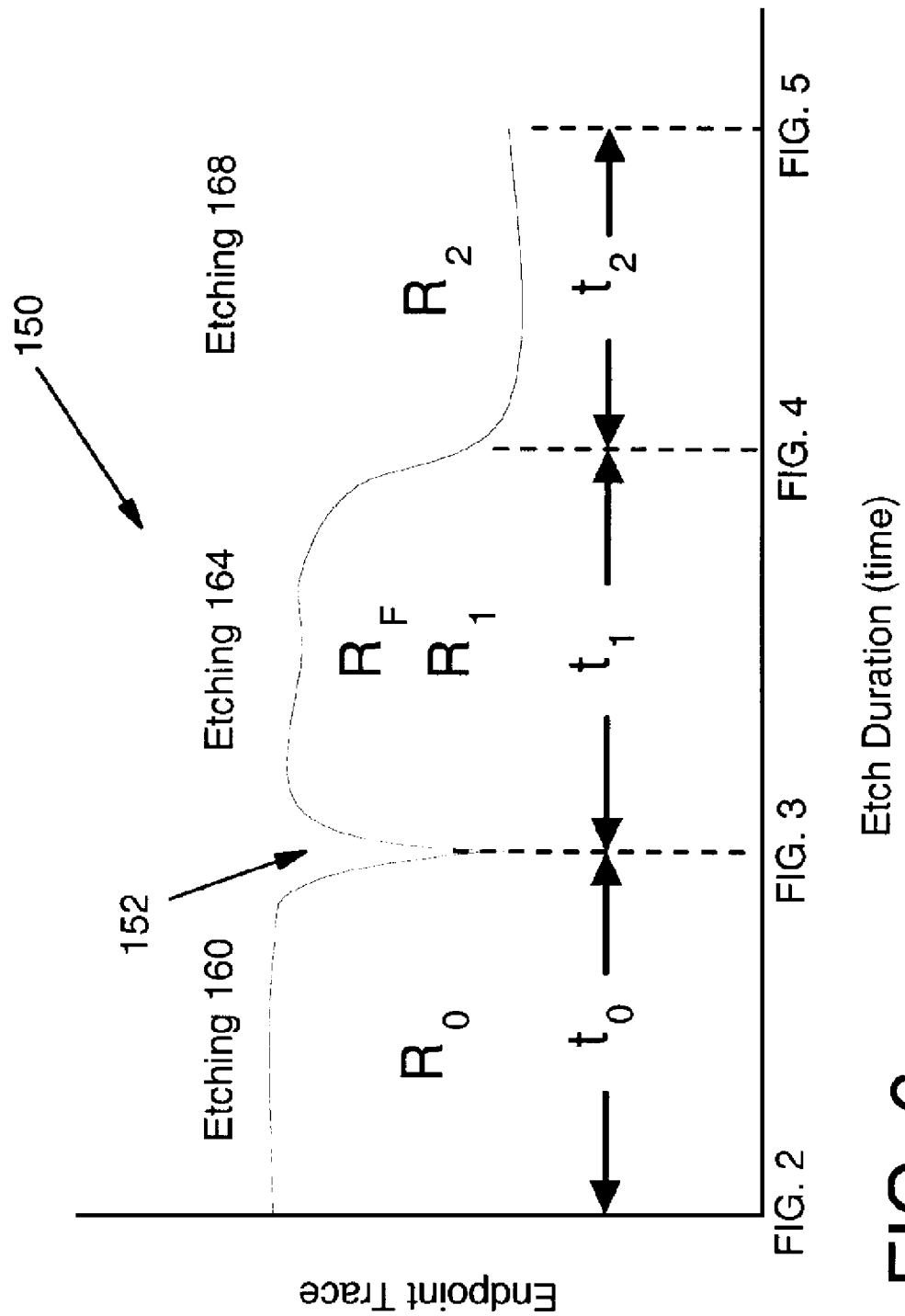

RECESSING TRENCH TO TARGET DEPTH USING FEED FORWARD DATA

BACKGROUND OF THE INVENTION

1. Technical Field

The invention relates generally to semiconductor device fabrication, and more particularly, to recessing a material in a trench to a target depth.

2. Background Art

A common process in trench technology is filling a trench with a filling material and then recessing the filling material to a predetermined depth. For example, to form a buried plate of a trench capacitor, an arsenic-doped glass (ASG) layer is deposited on a trench sidewall and the trench is filled with resist. The resist is then recessed to a predetermined depth to expose the ASG in the upper trench. The exposed ASG is then selectively removed to the resist in the lower trench. The resist is then removed from the trench, leaving ASG only on the lower trench sidewall. Arsenic in the ASG is then driven into the silicon substrate in a subsequent thermal process to form the buried plate—a heavily doped region in the substrate.

One challenge in this process is precisely controlling the depth of the resist recess, which is critical to determining device characteristics such as trench capacitance and parasitic leakage current. One approach to this challenge includes a 'send ahead' technique in which a wafer from a lot is processed first and the recess depth is measured. The process for the rest of the wafers is then adjusted based on the measured depth from the 'send ahead' wafer. The 'send ahead' approach has a number of disadvantages. First, it is destructive because the resist recess of the send ahead wafer is traditionally measured by a scanning electron microscope (SEM), which requires the send ahead wafer to be cleaved (destroyed) for SEM analysis. This approach is prohibitively costly. Second, the 'send ahead' approach is time-consuming. When a lot gets to the recess process, a send ahead wafer has to be split from the lot and processed first and the process is adjusted based on the send ahead. The turn-around-time for this send ahead approach may take several hours. Third, the process delay between the send ahead and the lot adds process variation since a condition of the recess chamber from which the send ahead wafer is pulled may change when the lot is processed. Fourth, the send ahead approach is not compatible with the currently automated 300 mm process because it requires dedicated manpower to take the send ahead wafer out of the lot, deliver it to SEM lab, and analyze the recess depth after the SEM is completed. Finally, the send ahead approach cannot accommodate incoming wafer-to-wafer variations such as variations of trench profile and the filling characteristics. The possible chamber condition change aggravates this situation. All these variations cause the recess depth variation from wafer to wafer. With the send ahead approach, the process is adjusted only once and then all wafers are processed with the same process setup. Accordingly, process adjustment to accommodate the above variation on each wafer is impossible using the send ahead approach.

Therefore, a simple process with precise recess control but without send ahead is desired.

SUMMERY OF THE INVENTION

Recessing a trench using feed forward data is disclosed. In one embodiment, a method includes providing a region on a wafer including a trench area that includes a trench and a field area that is free of any trench, and a material applied over the region so as to fill the trench in the trench area and form a step between the trench area and the field area; etching to partially etch the trench; determining a target etch duration ($t_D$) for etching to the target depth ($D_T$); and etching the trench to the target depth ($D_T$) for a period approximately equal to the target etch duration ($t_D$). The target etch duration $t_D$ may be fed forward for recessing another trench to the target depth $D_T$. The method does not require a send ahead wafer, is fully compatible with conventional automated processes and provides in-situ etch time correction to each wafer.

A first aspect of the invention provides a method of recessing a trench to a target depth ($D_T$), the method comprising the steps of: providing a region on a wafer including a trench area including a trench and a field area that is free of any trench, a material applied over the region so as to fill the trench in the trench area and form a step between the trench area and the field area; first etching the material until a surface of the wafer in the trench area is exposed; second etching the material until the surface of the wafer in the field area is exposed; determining a target etch duration ($t_D$) for a third etching for recessing the trench to the target depth; and third etching the trench to the target depth ($D_T$) for a period approximately equal to the target etch duration ($t_D$).

A second aspect of the invention provides an etching system for recessing a trench to a target depth ($D_T$), the system comprising: an etching chamber for etching a region on a wafer including a trench area including at least one trench and a field area that is free of any trench, a material applied over the region so as to fill the at least one trench in the trench area and form a step between the trench area and the field area; wherein the etching includes first etching the material until a surface of the wafer in the trench area is exposed, and second etching the material until the surface of the wafer in the field area is exposed; a determinator for determining a target etch duration ($t_D$) for a third etching for recessing the at least one trench to the target depth; and a communicator for feeding forward the target etch duration ($t_D$) for the third etching for recessing another trench to the target depth ($D_T$).

A third aspect of the invention provides a program product stored on a computer-readable medium, which when executed, controls recessing of a trench to a target depth ($D_T$), the program product comprising: program code for controlling etching of a region on a wafer including a trench area including at least one trench and a field area that is free of any trench, a material applied over the region so as to fill the at least one trench in the trench area and form a step between the trench area and the field area; wherein the etching includes first etching the material until a surface of the wafer in the trench area is exposed and second etching the material until the surface of the wafer in the field area is exposed; program code for determining a target etch duration ($t_D$) for a third etching for recessing the at least one trench to the target depth; and program code for feeding forward the target etch duration ($t_D$) for the third etching for recessing at least one trench to a target etch depth ($D_T$).

The illustrative aspects of the present invention are designed to solve the problems herein described and/or other problems not discussed.

BRIEF DESCRIPTION OF THE DRAWINGS

These and other features of this invention will be more readily understood from the following detailed description of the various aspects of the invention taken in conjunction with the accompanying drawings that depict various embodiments of the invention, in which:

FIG. 6 shows an endpoint trace according to one embodiment of the invention.

It is noted that the drawings of the invention are not to scale. The drawings are intended to depict only typical aspects of the invention, and therefore should not be considered as limiting the scope of the invention. In the drawings, like numbering represents like elements between the drawings.

DETAILED DESCRIPTION

Figure 1:
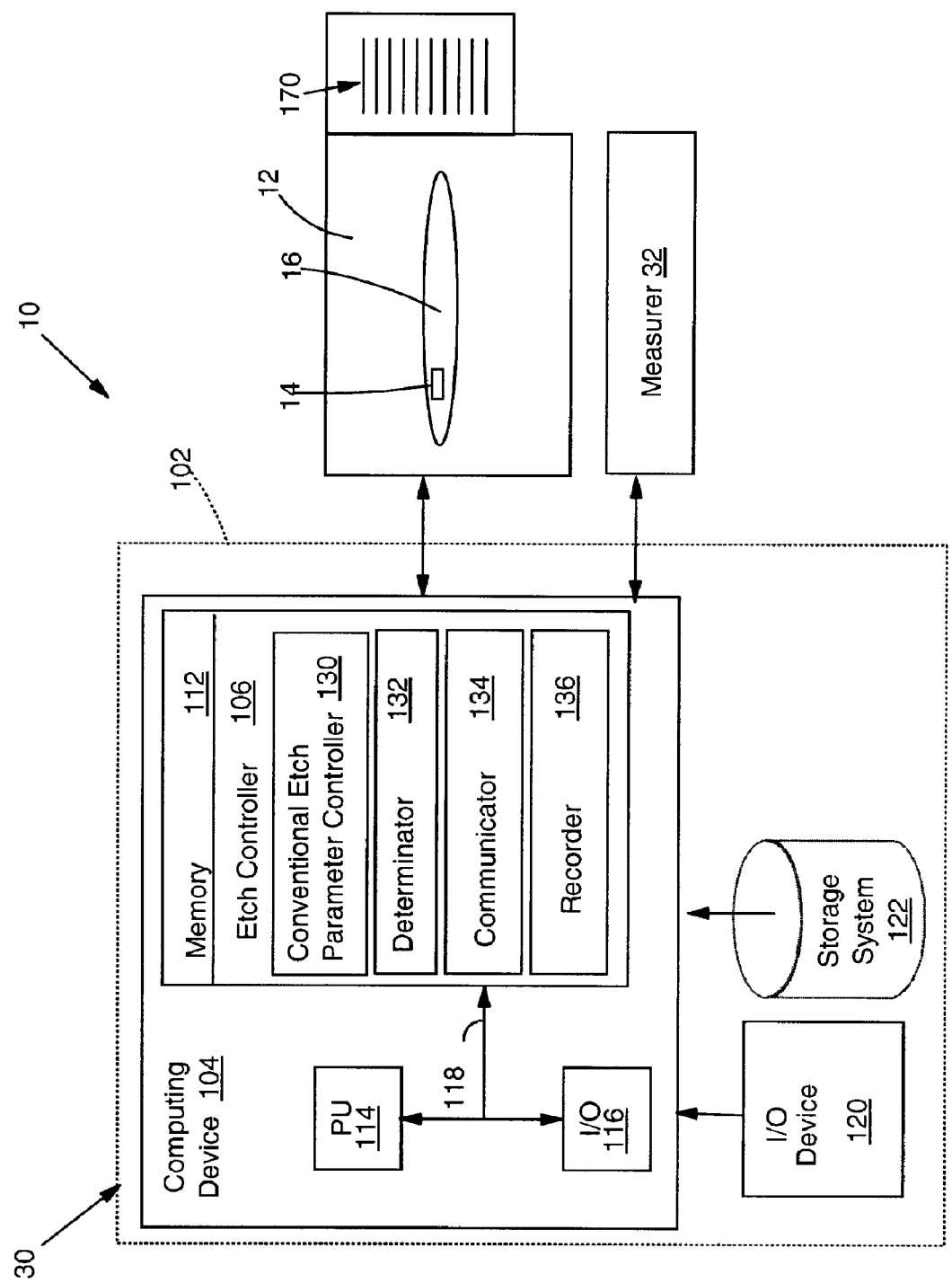
FIG. 1 shows an etching system for recessing a trench to a target depth ($D_T$) using feed forward of data according to one embodiment of the invention.
Figure 2:
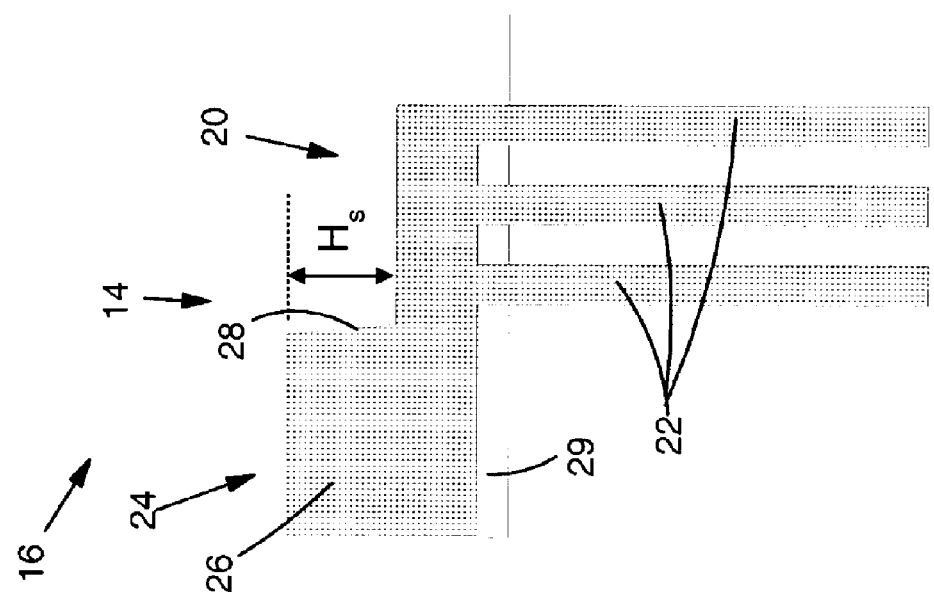

Turning to the drawings, FIG. 1 shows one embodiment of an etching system 10 for recessing a trench to a target depth ($D_T$) using feed forward of data according to the invention. Etching system 10 includes an etching chamber 12 for etching a region 14 on a wafer 16. Etching chamber 12 may include any now known or later developed structures for etching material on wafer 16, e.g., wet etching structure, plasma etching structure, chemical downstream etching structure, reaction ion etching structure, etc. As shown in FIG. 2, region 14 includes a trench area 20 including at least one trench 22 and a field area 24 that is free of any trench. A material 26 is applied over region 14 so as to fill at least one trench 22 in trench area 20 and form a step 28 between trench area 20 and field area 24. In one embodiment, material 26 may include a photoresist or any other material now known or later developed for use in filling a trench. Wafer 16 may also include a pad layer 29 of, for example, silicon nitride with an underlying silicon dioxide.

As is described in greater detail herein, and as shown in FIG. 1, etching system 10 also may include an etch controller system 30 for controlling recessing of a trench according to the invention. Etching system 10 may access a measurer 32 such as an atomic force microscope (AFM) for measuring a height $H_S$ of step 28 (FIG. 2). Etch controller system 30 may include a computer infrastructure 102 that can perform the various process steps described herein, inter alia, for recessing a trench to a target depth ($D_T$). In particular, computer infrastructure 102 is shown including a computing device 104 that comprises an etch controller 106, which enables computing device 104 to control the process steps of the invention.

Computing device 104 is shown including a memory 112, a processor unit (PU) 114, an input/output (I/O) interface 116, and a bus 118. Further, computing device 104 is shown in communication with an external I/O device/resource 120 and a storage system 122. As is known in the art, in general, processor unit 114 executes computer program code, such as etch controller 106, which is stored in memory 112 and/or storage system 122. While executing computer program code, processor 114 can read and/or write data, such as etching parameter data, to/from memory 112, storage system 122, and/or I/O interface 116. Bus 118 provides a communications link between each of the components in computing device 104. I/O device 120 can comprise any device that enables a user to interact with computing device 104 or any device that enables computing device 104 to communicate with one or more other computing devices.

In any event, computing device 104 can comprise any general purpose computing article of manufacture capable of executing computer program code installed by a user (e.g., a personal computer, server, handheld device, etc.). However, it is understood that computing device 104 and etch controller 106 are only representative of various possible equivalent computing devices that may perform the various process steps of the invention. To this extent, in other embodiments, computing device 104 and etch controller 106 can comprise any specific purpose computing article of manufacture comprising hardware and/or computer program code for performing specific functions, any computing article of manufacture that comprises a combination of specific purpose and general purpose hardware/software, or the like. In each case, the program code and hardware can be created using standard programming and engineering techniques, respectively.

Similarly, computer infrastructure 102 is only illustrative of various types of computer infrastructures for implementing the invention. For example, in one embodiment, computer infrastructure 102 comprises two or more computing devices (e.g., a server cluster) that communicate over any type of wired and/or wireless communications link, such as a network, a shared memory, or the like, to perform the various process steps of the invention. When the communications link comprises a network, the network can comprise any combination of one or more types of networks (e.g., the Internet, a wide area network, a local area network, a virtual private network, etc.). Regardless, communications between the computing devices may utilize any combination of various types of transmission techniques.

As previously mentioned and discussed further below, etch controller 106 enables computing infrastructure 102 to control recessing of a trench to a target depth $D_T$. To this extent, etch controller 106 is shown including: conventional etch parameter controller 130, a determinator 132 for determining a target etch duration $t_D$ for recessing the trench to target depth $D_T$, a communicator 134 for feeding forward target etch duration $t_D$ for recessing another trench to target depth $D_T$, and a recorder 136 for recording an etch duration t of a predetermined part of an etching process. Operation of each of the above-described systems is discussed further below. However, it is understood that some of the various systems shown in FIG. 1 can be implemented independently, combined, and/or stored in memory for one or more separate computing devices that are included in computer infrastructure 102. Further, it is understood that some of the systems and/or functionality may not be implemented, or additional systems and/or functionality may be included as part of the environment of etching system 10. Conventional etch parameter controller 130 may include any functionality known to those skilled in the art as being provided with a conventional etch system for controlling etching of region 14. Operational structure of etch chamber 12 has not been illustrated for clarity.

Turning to FIGS. 2-6, various embodiments of a method of recessing a trench to target depth $D_T$ using feed forward of data and etch controller system 30 will now be described. In a first step, as shown in FIG. 2, region 14 on wafer 16 including trench area 20 having at least one trench 22, and field area 24 that is free of any trench 22, is provided. In one embodiment, trench area 20 includes an array of trenches, but this is not necessary. In addition, material 26, e.g., a photoresist or other fill material, is applied over region 14 so as to fill at least one trench 22 in trench area 20 and form step 28 between trench area 20 and field area 24. Step 28 has a height $H_S$ that can be measured by a profilometer such as an atomic force microscope (AFM). In one embodiment, wafer 16 may include a pad layer 29 which may include a silicon nitride and an underlying silicon dioxide.

Figure 3:
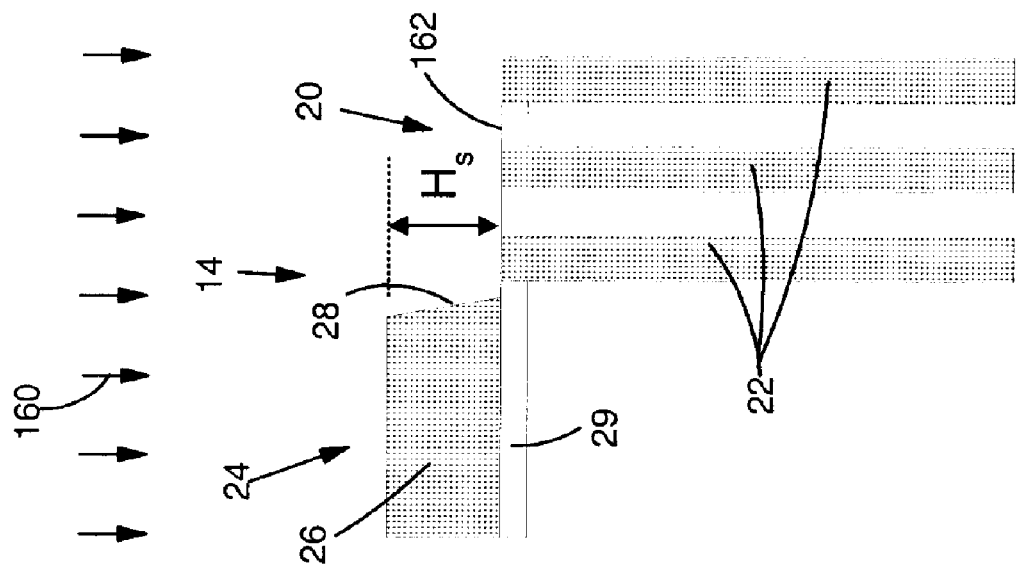
FIGS. 2-5 show stages of etching according to one embodiment of the invention.

FIGS. 2-5 show various stages of etching at least one trench 22. The type of etching conducted, e.g., reactive ion etching, wet etching, plasma etching, downstream etching, etc., is not described in detail herein because it varies depending on the material being etched and is within the purview of one with skill in the art. As shown in FIG. 6, as the etching stages proceed, recorder 136 (FIG. 1) may record durations of the different stages and/or generate an endpoint trace 150 of the etching. That is, recorder 136 may perform endpoint tracing and monitor the trace of the etching stages to determine an endpoint of each etching stage. As known in the art, an "endpoint trace" can be generated by monitoring the trace of emissions from a reactive species or volatile product using optical emission during etching, which changes as different materials are etched. A change in endpoint trace 150 indicates a change in materials that are being etched, and hence different stages of the etching, the durations of which can be determined readily from endpoint trace 150. For example, in FIG. 6, a first dip 152 indicates that the etching has reached pad layer 29 in trench area 20, as shown in FIG. 3. First dip 152 may be caused by all resist material 26 in trench area 20 above pad layer 29 being removed and pad layer 29 being exposed.

Figure 4:
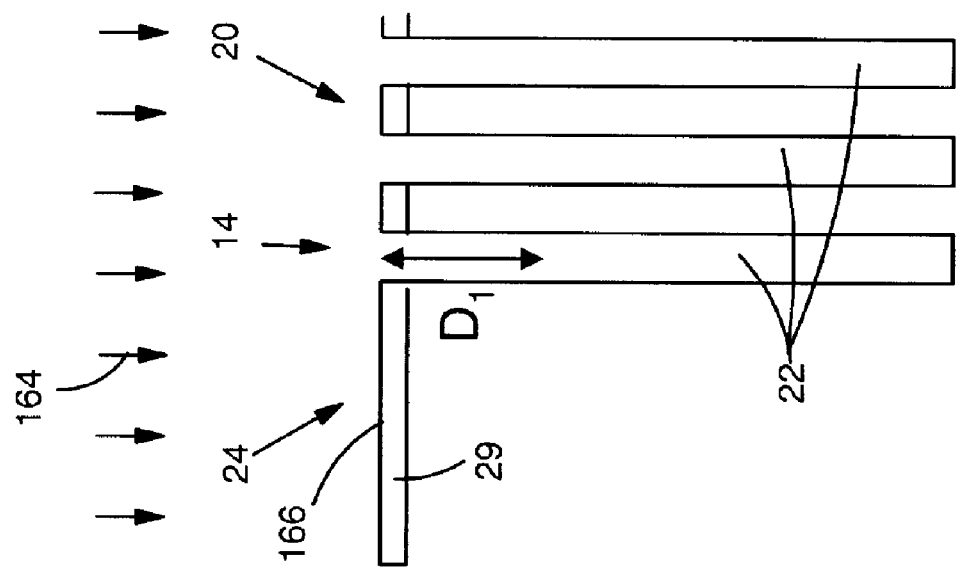

In a first etching 160, shown in FIG. 3, material 26 is etched until a surface 162 of wafer 16 in trench area 20, e.g., pad layer 29, is exposed. Recorder 136 (FIG. 1) may record that etching 160 has an etch rate $R_0$ and a duration $t_0$, as indicated in FIG. 6. That is, recorder 136 may monitor endpoint trace 150 of first etching 160 to determine an endpoint of the etching step. As shown in FIG. 4, a next stage of etching 164 includes etching material 26 until a surface 166 of wafer 16 in field area 24 is exposed. Simultaneously, trench(es) 22 are etched to a first depth $D_1$, which is less than target depth $D_T$. As indicated in FIG. 6, recorder 136 (FIG. 1) may record that etching 164 has an etch rate $R_1$ in trench area 20 and an etch rate $R_F$ in field area 24 and a duration $t_1$, i.e., recorder 136 may monitor endpoint trace 150 of second etching 164 to determine an endpoint of the etching step.

Figure 5:
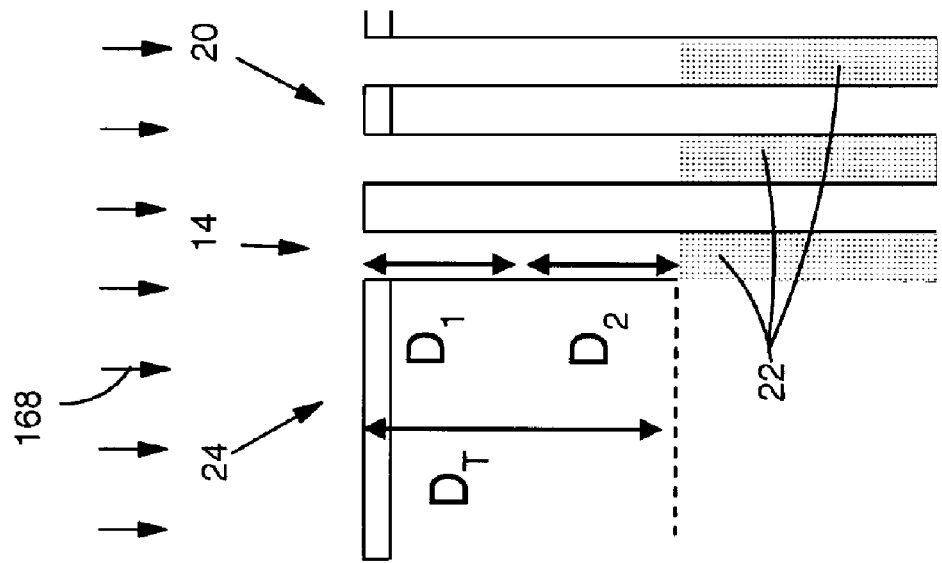

A next step of the method includes determinator 132 (FIG. 1) determining a target etch duration $t_D$ for etching 168 (FIG. 5) for recessing trench(es) 22 to target depth $D_T$. As shown in FIG. 5, etching 168 recesses material 26 (now only in trench(es) 22) until target depth $D_T$ is achieved in trench(es) 22. Target depth $D_T$ is the sum of first depth $D_1$ and a second depth $D_2$, the latter achieved by etching 168, i.e., $D_T=D_1+D_2$. As indicated in FIG. 6, recorder 136 (FIG. 1) may record that etching 168 has an etch rate $R_2$ in trench area 20 and a duration $t_2$. Note that etch rate $R_2$ may be greater than etch rate $R_1$ in trench area 20 at the same etching conditions because of the absence of material 26 in field area 24. All etch rates can be predetermined based on conventional techniques, e.g., based on known etch rates of known etch chemistries. Note that target etch duration $t_D$ corresponds to etch duration $t_2$ in FIG. 6. In a first embodiment, determinator 132 may determine target etch duration $t_D$ according to the following equation:

$$t_D=(D_T-R_1 t_1)/R_2 \quad (1)$$

As noted above, $t_1$ is the duration of etching 160 (FIG. 3), $R_1$ is the etch rate of trench area 20 during etching 164 (FIG. 4) and $R_2$ is the etch rate of trench area 24 during etching 168 (FIG. 5). The above equation is derived from the knowledge that first depth $D_1=R_1 t_1$, second depth $D_2=R_2 t_2$, where $t_D$ and $t_2$ are equivalent, and $D_T=D_1+D_2$.

In another embodiment, determinator 132 (FIG. 1) determines target etch duration $t_D$ according to the following equation:

$$t_D=(D_T-H_s R_1/R_F)/R_2 \quad (2)$$

As noted above, $H_S$ is the height of step 28 (FIG. 2), $R_1$ is the etch rate of trench area 20 during etching 164 (FIG. 4), $R_2$ is the etch rate of trench area 20 during etching 168 (FIG. 5) and $R_F$ is the etch rate of field area 24 during etching 168 (FIG. 5). The above equation is derived from the knowledge that first depth $D_1=R_1 t_1$, second depth $D_2=R_2 t_2$, step height $H_s=R_F t_1$ where $t_D$ and $t_2$ are equivalent, and $D_T=D_1+D_2$. This embodiment requires measurer 32 (FIG. 1) to measure height $H_S$ of step 28 (FIG. 2), but it does not require information from the endpoint trace as all variables for calculating $t_D$ based on equation (2) are known.

A final step includes etching 168 (FIG. 5) in trench(es) 22 to target depth ($D_T$) for a period approximately equal to target etch duration ($t_D$). This step may also include communicator 134 feeding forward target etch duration $t_D$ for etching 168 (FIG. 5) for recessing the same trench or another trench in wafer 16 or another wafer 170 (FIG. 1) to target depth $D_T$. The implementation of communicator 134 may vary depending on the environment. For example, communicator 134 may simply be an internal recordation for use in etching other regions of wafer 16 in etch chamber 12, or it may include some form of communication mechanism, e.g., a network, for feed forwarding data to other etch chambers (not shown).

It is understood that the order of the above-described steps is only illustrative. To this extent, one or more steps can be performed in parallel, in a different order, at a remote time, etc. Further, one or more of the steps may not be performed in various embodiments of the invention.

While shown and described herein as a method and system for recessing a trench to a target depth $D_T$ using feed forward of data, it is understood that the invention further provides various alternative embodiments. For example, in one embodiment, the invention provides a computer-readable medium that includes computer program code to enable a computer infrastructure to control recessing of a trench to target depth $D_T$ using feed forward of data. To this extent, the computer-readable medium includes program code, such as etch controller 106 (FIG. 2), which implements each of the various process steps of the invention. It is understood that the term "computer-readable medium" comprises one or more of any type of physical embodiment of the program code. In particular, the computer-readable medium can comprise program code embodied on one or more portable storage articles of manufacture (e.g., a compact disc, a magnetic disk, a tape, etc.), on one or more data storage portions of a computing device, such as memory 112 (FIG. 2) and/or storage system 122 (FIG. 2) (e.g., a fixed disk, a read-only memory, a random access memory, a cache memory, etc.), and/or as a data signal traveling over a network (e.g., during a wired/wireless electronic distribution of the program code).

In another embodiment, the invention provides a business method that performs the process steps of the invention on a subscription, advertising, and/or fee basis. That is, a service provider, such as an Application Service Provider, could offer to control recessing a trench to a target depth ($D_T$) using feed forward of data on a remote etch chamber 12 (FIG. 1), as described above. In this case, the service provider can manage (e.g., create, maintain, support, etc.) a computer infrastructure, such as computer infrastructure 102 (FIG. 1), that performs the process steps of the invention for one or more customers. In return, the service provider can receive payment from the customer(s) under a subscription and/or fee agreement and/or the service provider can receive payment from the sale of advertising space to one or more third parties.

In still another embodiment, the invention provides a method of generating a system for controlling recessing a trench to a target depth ($D_T$) using feed forward of data. In this case, a computer infrastructure, such as computer infrastructure 102 (FIG. 1), can be obtained (e.g., created, maintained, having made available to, etc.) and one or more systems for performing the process steps of the invention can be obtained (e.g., created, purchased, used, modified, etc.) and deployed to the computer infrastructure. To this extent, the deployment of each system can comprise one or more of (1) installing program code on a computing device, such as computing device 104 (FIG. 1), from a computer-readable medium; (2) adding one or more computing devices to the computer infrastructure; and (3) incorporating and/or modifying one or more existing systems of the computer infrastructure, to enable the computer infrastructure to perform the process steps of the invention.

As used herein, it is understood that the terms "program code" and "computer program code" are synonymous and mean any expression, in any language, code or notation, of a set of instructions intended to cause a computing device having an information processing capability to perform a particular function either directly or after any combination of the following: (a) conversion to another language, code or notation; (b) reproduction in a different material form; and/or (c) decompression. To this extent, program code can be embodied as one or more types of program products, such as an application/software program, component software/a library of functions, an operating system, a basic I/O system/driver for a particular computing and/or I/O device, and the like The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to a person skilled in the art are intended to be included within the scope of the invention as defined by the accompanying claims.

What is claimed is:

1. A method of recessing a trench to a target depth ($D_T$), the method comprising the steps of:

providing a region on a wafer including a trench area including a trench and a field area tat is free of any trench, a material applied over the region so as to fill the trench in the trench area and form a step between the trench area and the field area;

first etching the material until a surface of the wafer in the trench area is exposed;

second etching the material until the surface of the wafer in the field area is exposed;

measuring a height of the step ($H_S$);

determining a target etch duration ($t_D$) for a third etching far recessing the trench to the target depth; and third etching the trench to the target depth ($D_T$) for a period approximately equal to the target etch duration ($t_D$).

2. The method of claim 1, wherein the material includes a photoresist.

3. The method of claim 1, further comprising the step of recording a first etch duration ($t_1$) of the second etching.

4. The method of claim 3, wherein the target etch duration ($t_D$) determining step includes determining the target etch duration ($t_D$) according to the following equation:

$$t_D = (D_T - R_1 t_1)/R_2,$$

wherein $R_1$ is a first etch rate of the trench area during the second etching and $R_2$ is a second etch rate of the trench area during the third etching.

5. The method of claim 1, wherein the target etch duration ($t_D$) determining step includes determining the target etch duration ($t_D$) according to the following equation:

$$t_D = (D_T - H_S R_1/R_F)R_2,$$

wherein $H_S$ is a height of the step, $R_1$ is a first etch rate of the trench area during the second etching, $R_2$ is a second etch rate of the trench area during the third etching and $R_F$ is a third etch rate of the field area during the second etching.

6. The method of claim 1, further comprising feeding forward the target etch duration ($t_D$) for the third etching for recessing another trench to the target depth ($D_T$).

7. The method of claim 1, wherein the trench area includes an array of trenches.

8. The method of claim 1, further comprising monitoring an endpoint trace of each the first and second etching steps to determine an endpoint of each etching step.

* * * * *